United States Patent
Gschwind

(10) Patent No.: US 7,051,255 B2
(45) Date of Patent: May 23, 2006

(54) METHOD AND APPARATUS FOR REDUCING POWER DISSIPATION IN LATCHES DURING SCAN OPERATION

(75) Inventor: Michael K. Gschwind, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 425 days.

(21) Appl. No.: 10/326,784

(22) Filed: Dec. 20, 2002

(65) Prior Publication Data

US 2004/0123198 A1    Jun. 24, 2004

(51) Int. Cl.
  *G01R 31/28* (2006.01)
(52) U.S. Cl. .................................................. 714/726
(58) Field of Classification Search ................ 714/726, 714/727, 729, 724, 733, 734, 30; 377/54, 377/64, 70, 73
  See application file for complete search history.

(56) References Cited

U.S. PATENT DOCUMENTS 5,459,735 A * 10/1995 Narimatsu .................. 714/731
5,719,504 A * 2/1998 Yamada ........................ 326/16
6,023,778 A * 2/2000 Li ............................... 714/726

OTHER PUBLICATIONS

Ismet Bayraktaroglu, et al, (2001), Test Volume and Application Time Reduction Through Scan Chain Concealment, DAC, pp. 1-5.

* cited by examiner

*Primary Examiner*—Christine T. Tu
(74) *Attorney, Agent, or Firm*—Scully, Scott, Murphy & Presser, P.C.; Satheesh K. Karra, Esq.

(57) ABSTRACT

A method and apparatus for reducing power dissipation during a scan operation during testing of digital logic circuits which provides for scanning data while switching a limited number of nodes during scan-in and scan-out of input and result chains, and which isolates the logic circuit from random stimulation by scan chains as they are scanned. A scan chain includes a plurality of level sensitive scan design LSSD scan latches, each comprising a master latch M and a slave latch S. The master latch has a first input port D used for operation in a functional mode, and a second input port S used for operation in a scan mode, a scan enable input port, and a clock input port. The master latch M produces output scan data Sout which is directed to a slave latch S which produces a data output Q for the logic circuit under test.

18 Claims, 8 Drawing Sheets

LSSD Latch

LSSD Latch

LSSD Scan Chain Operation

Operation of LSSD Chain

METHOD AND APPARATUS FOR REDUCING POWER DISSIPATION IN LATCHES DURING SCAN OPERATION

BACKGROUND OF THE INVENTION

The present invention relates generally to power and power-density management in electronic systems for testing digital logic circuits. More particularly, the subject invention pertains to a method and apparatus for reducing power dissipation during a scan operation during testing of digital logic circuits which provides for scanning data while switching a limited number of nodes during scan-in and scan-out of input and result chains, and which isolates the logic circuit from random stimulation by scan chains as they are scanned.

As the complexity of today's circuits limits the practicability of sequential test generation to small circuits only, scan testing has been commonly used to ensure easy diagnosis and test generation times within practical limits.

While scan testing helps keep test generation times within limits, the large number of scan cells and patterns generated, as a result, increase the test data volume and the tester time requirements inordinately. The increases in turn boost test application cost by necessitating prolonged utilization of increasingly expensive testers.

As the sizes of the circuits increase, the pin to gate ratio reduces. Since the number of scan chains, which is limited by the number of I/O pins, cannot increase, the number of cells per scan chain has to increase, which directly affects test time.

Test time directly impacts the chip cost and hence it is of paramount importance to reduce test time. Two options are open to reduce the time used for scan testing:

the volume of data processed with scan testing can be reduced, or the speed with which processing occurs can be increased.

A number of schemes have been proposed for test data volume reduction of scan-based deterministic testing by improving the effectiveness of test compaction and compression schemes. While compaction schemes try to reduce the number of patterns generated without compromising fault coverage levels, compression schemes in turn target reduction of the storage requirements of the compacted test patterns. Additionally, shifting the decompression task to the circuit under test reduces test application times. A description of one test volume reduction scheme, as well as references to additional such schemes can be found in Ismet Bayraktaroglu and Alex Orailoglu, "Test Volume and Application Time Reduction Through scan Chain Concealment", Design Automation Conference 2001.

Traditionally, scan testing has occurred at speeds well below the nominal operating frequency. One reason for this lower operating frequency during scan testing has been the potential for chip damage due to excessive power dissipation. Power dissipation is generated from two distinct aspects of the scan testing operation, (1) the need to switch all latches with highly random data which leads to higher switching activity than during normal operation, and (2) the stimulation of logic with the highly random activity during every cycle of the scanning process, leading to higher than normal glitch rates in the logic.

SUMMARY OF THE INVENTION

Therefore, there is a need to reduce the amount of heat produced during a scan operation so that scan testing may occur at higher speeds in order to reduce test time and cost.

Further, an improved method and apparatus is necessary to eliminate the danger of damage to devices under test as a result of excessive heat dissipation during scan operation.

The present invention provides for scanning data with a limited number of nodes being switched during scan-in and scan-out of input and result chains, and by isolating the logic from random stimulation by scan chains as they are scanned.

Furthermore the scan chains of the present invention are connected without any change to the design flow of the circuits employing the method(s) of the present invention.

DETAILED DESCRIPTION OF THE INVENTION

Those skilled in the art will appreciate that while the exemplary embodiment and its descriptions are based upon an LSSD (level sensitive scan design)-based latching style, that the teachings contained herein can be applied to other latching styles as well.

Figure 1:
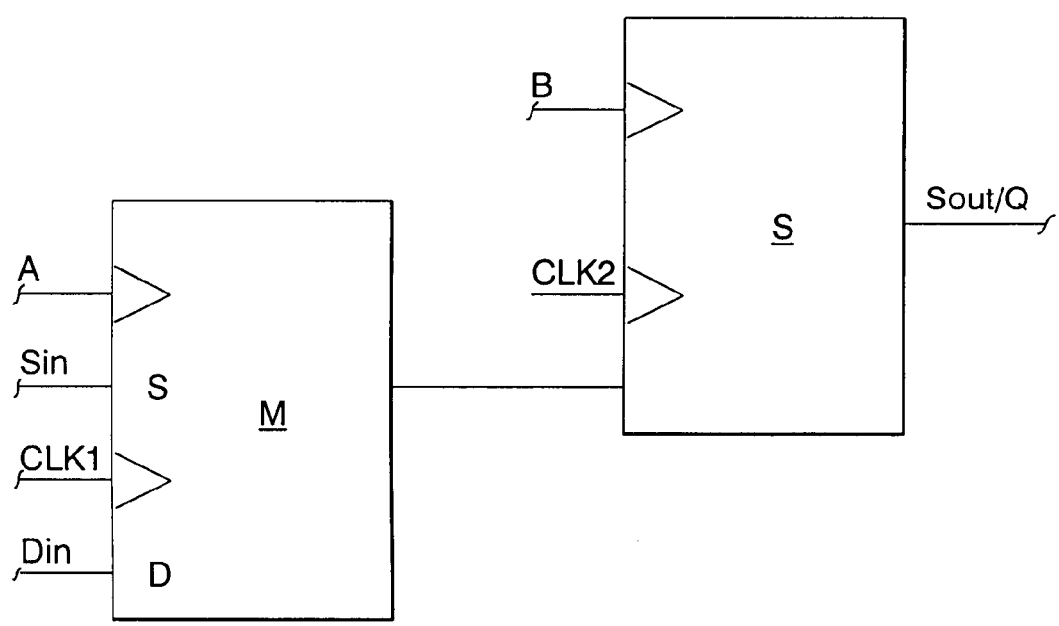
FIG. 1 shows an LSSD (level sensitive scan design) latch in accordance with the prior art.

FIG. 1 shows an LSSD latch in accordance with the prior art consisting of a first half master latch (M) and a second half slave latch (S).

There are two sets of inputs to an LSSD latch, those used for operation in the functional mode, and those used for operation in the scan mode.

In the functional mode, the data to be latched are an input Din to the D port, and are latched by the master latch M when the CLK1 signal is high. When CLK2 goes high, the output of master latch M is latched by the slave latch S, and is the output Q of the master/slave LSSD latch. CLK1 and CLK2 usually are two local non-overlapping high-speed clocks generated by a local clock buffer (LCB) from a global clock G and distributed using high-speed clock wiring.

In the scan mode, the data to be latched are an input Sin to the S port, and are latched by the master latch when the A signal is high. When B goes high, the output of master latch M is latched by the slave latch S, and is the output Sout of the master/slave LSSD latch. A and B usually are two non-overlapping scan clocks operated at appreciably lower speeds than the functional mode. This allows scan signals (in particular, the scan chain connecting Sout of a previous scan element with Sin of the present element, and the scan clocks A and B) to be wired using less stringent signal requirements.

Note that in the prior art arrangement of FIG. 1, the output Q in the functional mode shares a single port output with the output Sout in the scan mode, and this type of single port shared arrangement is avoided by the present invention to avoid changes in one output adversely changing the other output, particularly when the logic scan chain is in operation and no logic activity by the logic is required to perform the scan in process or the scan out process.

Figure 2:
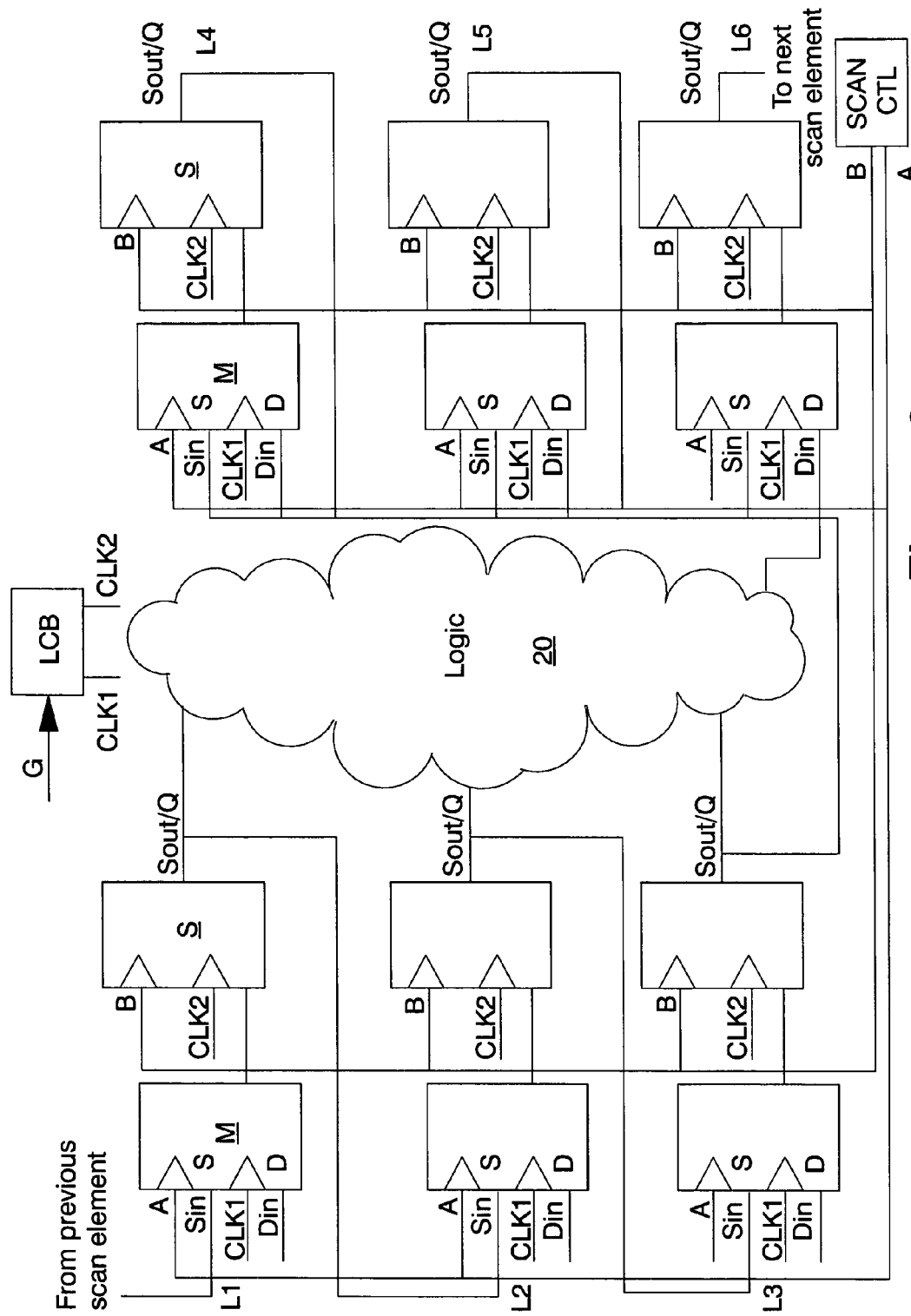
FIG. 2 illustrates a scan chain consisting of LSSD latches in accordance with the prior art.

Referring now to FIG. 2, there is shown a section of a prior art LSSD scan chain, containing 6 scan elements labeled L1 through L6, wherein the output of L1 is an input to L2, and etc., and logic 20 under test. A local clock buffer LCB and scan control SCAN CTL blocks are also provided. The local clock buffer LCB receives an input global clock signal G and generates local non-overlapping clock signals CLK1 and CLK2 for distribution over high-speed low-skew clock routes to the scan elements L1–L6. The scan control block SCAN CTL generates scan control signals A and B which are distributed to the scan elements L1–L6 using lower speed routes as the scan-chain operation is at frequencies significantly below functional operating frequencies. Those skilled in the art will understand that merged LCB/scan control logic is also possible.

FIG. 2 also shows how LSSD latches are arranged into "scan chains", wherein the scan out signal Sout of a previous element Ln−1 of a scan chain is connected to the scan in signal Sin of the next element Ln in the scan chain.

FIG. 2 furthermore shows the Q (data out) port connected to the input of the logic 20 under test, and the output of the logic 20 connected to Din (data in) ports of latches. Note that the Sout scan signal and Q data out share a common port, which the present invention distinguishes from by using separate ports for Sout and Q for reasons explained below.

Figure 3:
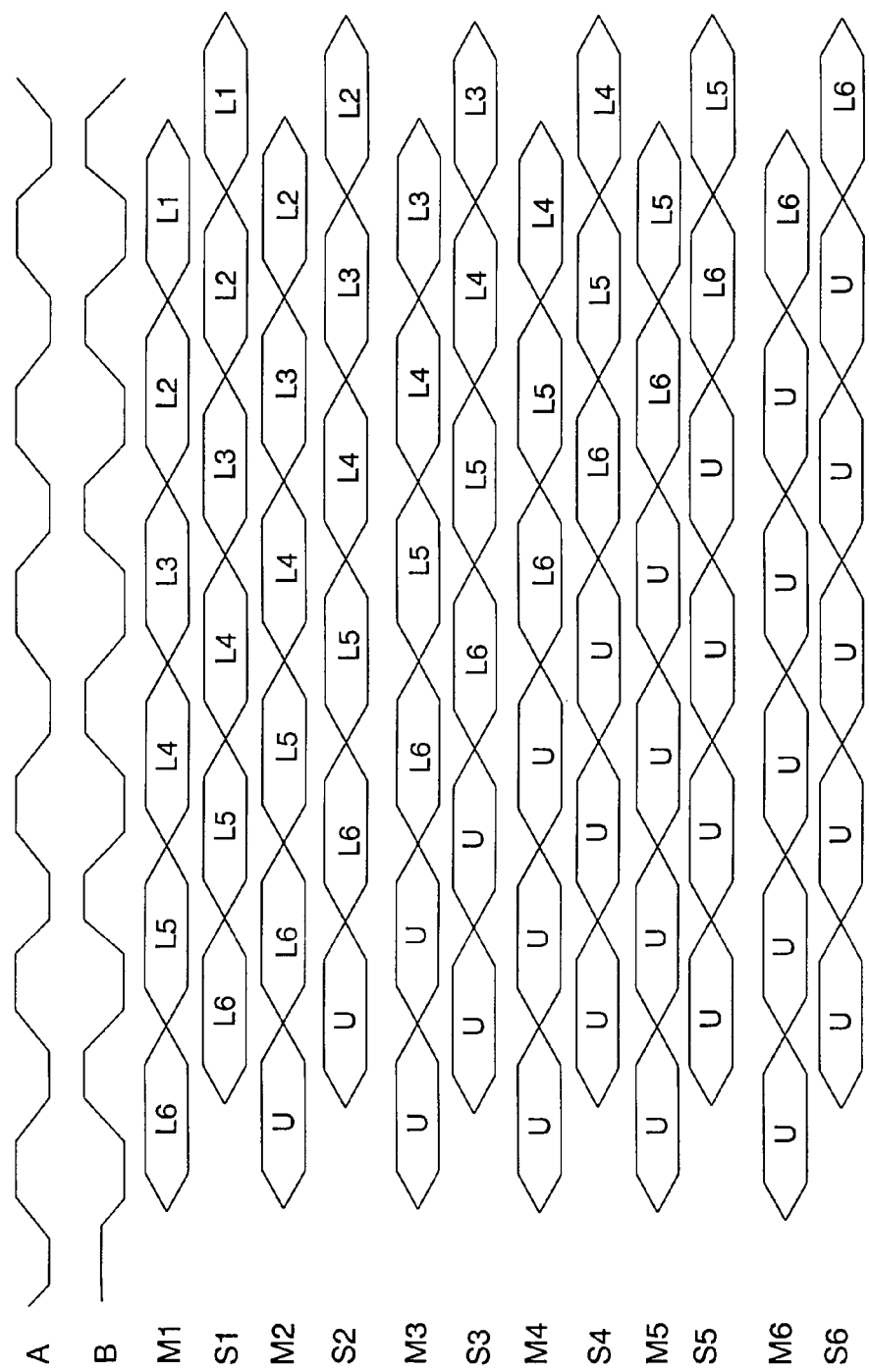
FIG. 3 shows waveforms illustrative of the operation of the scan-in operation for an LSSD latch in accordance with the prior art.

Referring now to FIG. 3, there is shown a waveforms diagram illustrative of the operation of the scan chain using the A and B scan control signals in accordance with the prior art. In FIG. 3, the A and B scan control signals are shown as the top two waveforms, the master latches Mn and slave latches Sn are shown in the left column starting at M1 at the top and ending with S6 at the bottom, Ln stands for logic values destined for latch n, and U stands for unused (no signal). Thus, one can see that L6 which represents data values destined for latch 6 are introduced into the master latch M1 at the earliest time in the upper left portion of FIG. 3, and are transferred successively to latches S1, M2, etc., proceeding diagonally from the upper left to the lower right, to latch S6. In the far right portion of FIG. 3, data values destined for latches L1–L6 are stored in slave latches S1–S6. During this sequence of operations, each of the master latches Mn and each of the slave latches Sn changes data values a multiple number of times.

Those skilled in the art will understand that the operation of a scan chain with N master/slave LSSD latches requires N pulses of clock A to latch data into N master latches, and N pulses of clock B to latch data into N slave latches, for a total of $2*N^2$ transitions, such that FIG. 3 shows 6 pulses of clock A and 6 pulses of clock B before the right side of FIG. 3 shows data latched into all of latch pairs L1–L6.

Figure 4:
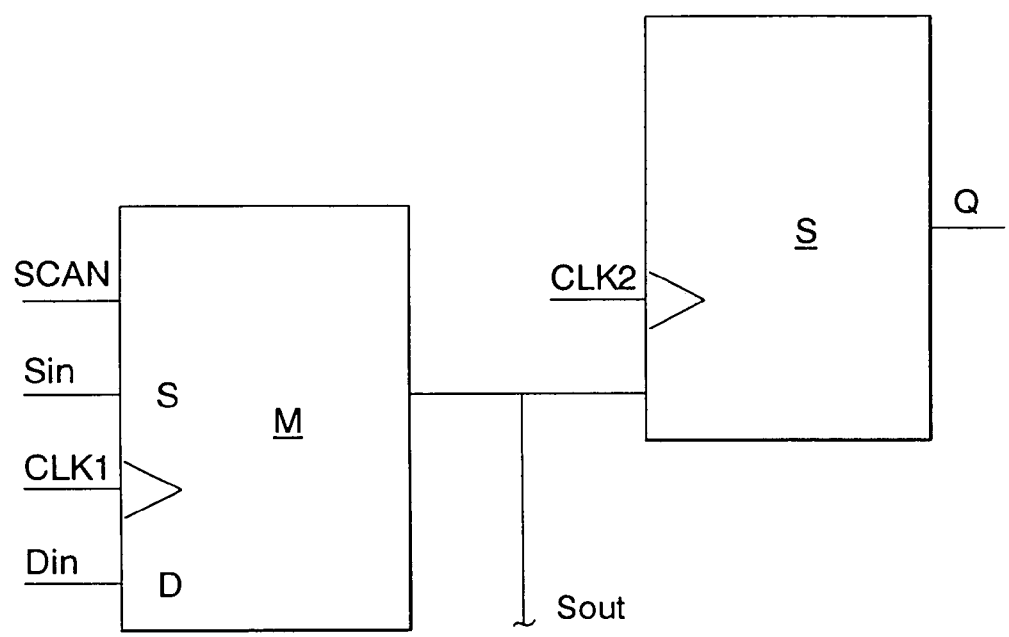
FIG. 4 illustrates a modified high speed scan (HSS) LSSD latch in accordance with the present invention.

Referring now to FIG. 4, there is shown an exemplary embodiment of a latch, in particular an LSSD latch, in accordance with the present invention which comprises a first half master latch M and a second half slave S. In this exemplary embodiment, the LSSD latch has been modified to reduce the number of latch transitions necessary to scan in a set of data values, as well as to shield the logic from data changes during scan operation to avoid power dissipation in the latches. Note that the scan output Sout of the master latch M is on a separate output line from the data output Q of the slave latch S, which is different from the prior art LSSD scan of FIG. 1.

Figure 5:
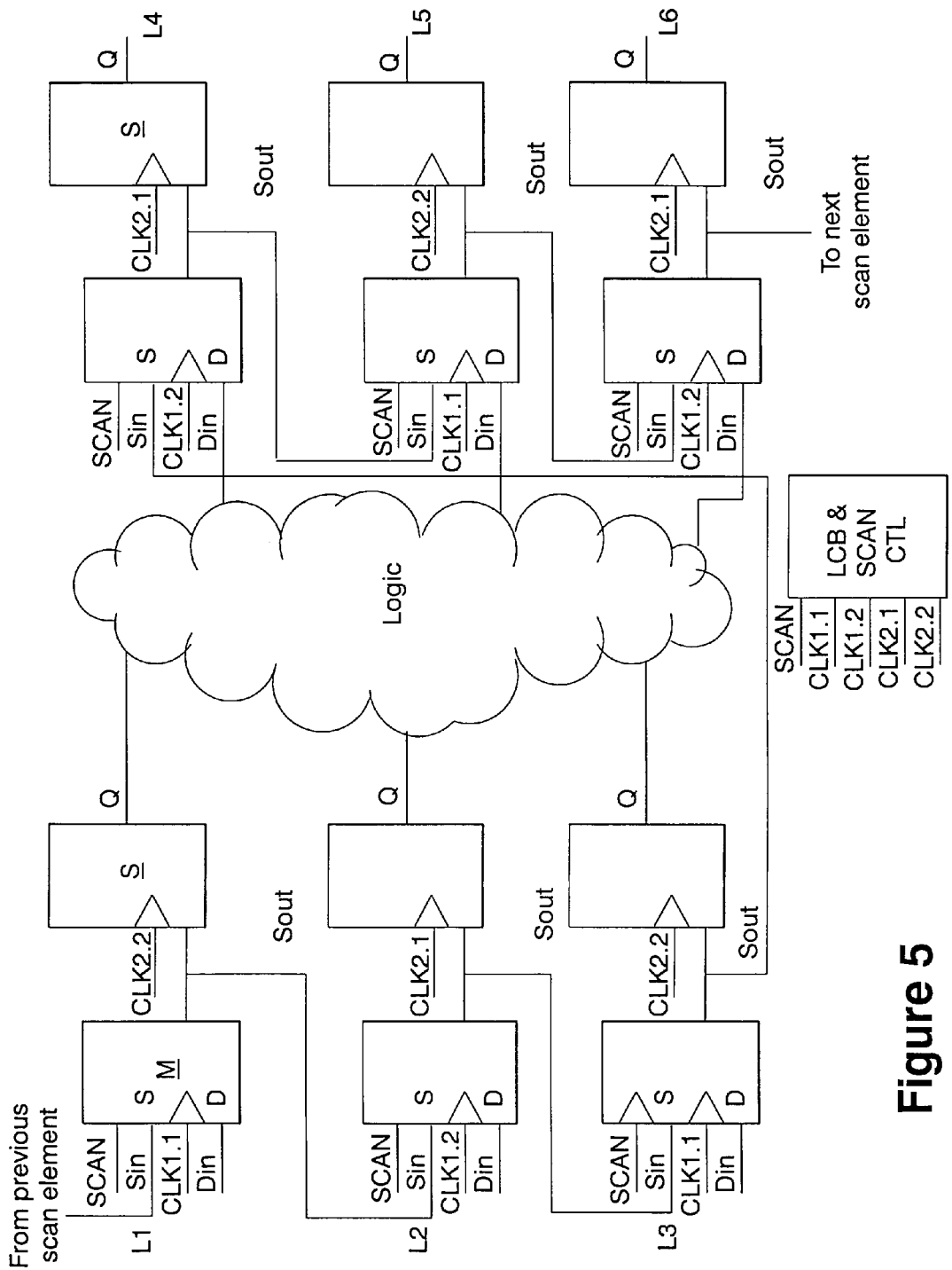
FIG. 5 illustrates a scan chain consisting of a series of HSS-LSSD latches connected in accordance with the present invention.

Thus, the present invention offers reduced power dissipation in the logic under test due to isolation of the logic under test from scan chain values Sout, as illustrated in FIG. 5, as well as reduced power dissipation from a reduced number of operations.

An exemplary LSSD latch in accordance with the present invention has the following features which are illustrated in FIG. 5 which shows a scan chain consisting of a plurality of scan latches in accordance with the present invention.

1) There are two sets of inputs, those used in the functional mode (Din), and those used for operation in the scan mode (Sin).

2) In the functional mode, the data to be latched (Din) are taken from the D port of the master latch M, and are latched by the master latch M when the CLK1 signal is high. When CLK2 input to the slave latch S goes high, the output of the master latch M is latched by the slave latch S, and is the output Q of the master/slave LSSD latch. CLK1 and CLK2 usually are two local non-overlapping high-speed clocks generated by a local clock buffer (LCB) from a global clock signal G and distributed using high-speed clock wiring.

3) In the scan mode, the SCAN input pin is asserted by the scan control logic SCAN CTL. Scan data to be latched (Sin) are taken from the S port of the master latch M, and are latched by the master latch M when the CLK1 signal is high and the SCAN signal is asserted. The output of the master latch M of an LSSD latch are provided as a scan out signal Sout for the next scan element. When the signal CLK2 input to the slave latch S goes high, the output of the master latch M is latched by the slave latch S, and is the output Q of the master/slave LSSD latch which is an input to the logic under test.

In an alternative embodiment, the slave latch S has an additional control port B adapted to scan in data during a scan chain operation (similarly to port B in embodiments in accordance with prior art).

Referring now to FIG. 5, there is shown a scan chain consisting of a plurality of scan latches L1 through L6 in accordance with the present invention.

In order to reduce the number of transitions necessary during a scan operation, a scan chain is assembled exclusively of the first phase (corresponding to the master M of functional operation). Thus the scan output Sout of a master Mn−1 is an input to the next master Mn. During a scan operation, two such half latches (both master latches M of distinct LSSD latches) are combined to form a master slave latch for the scan operation. This is achieved by routing distinct signals CLK1.1 and CLK1.2 to the CLK1 ports of alternating elements of the scan chain.

During a functional operation, these nets, denominated CLK1.1 and CLK1.2 carry the same master latch clock signal. However, during a scan operation, CLK1.1 and CLK1.2 form two non-overlapping phases used for the scan operation.

Similarly, ports CLK2 for the slave latches S are connected to alternating nets denominated CLK2.1 and CLK2.2. During a functional operation, these nets carry the same slave latch clock signal. However, during a scan operation, CLK2.1 and CLK2.2 form two non-overlapping phases, and are used to control sampling of data from the scan chain consisting of the first phase master latches into alternating sets of slave the latches.

Thus in the arrangement of FIG. 5, the data Q values do not change during a scan operation.

Figure 6:
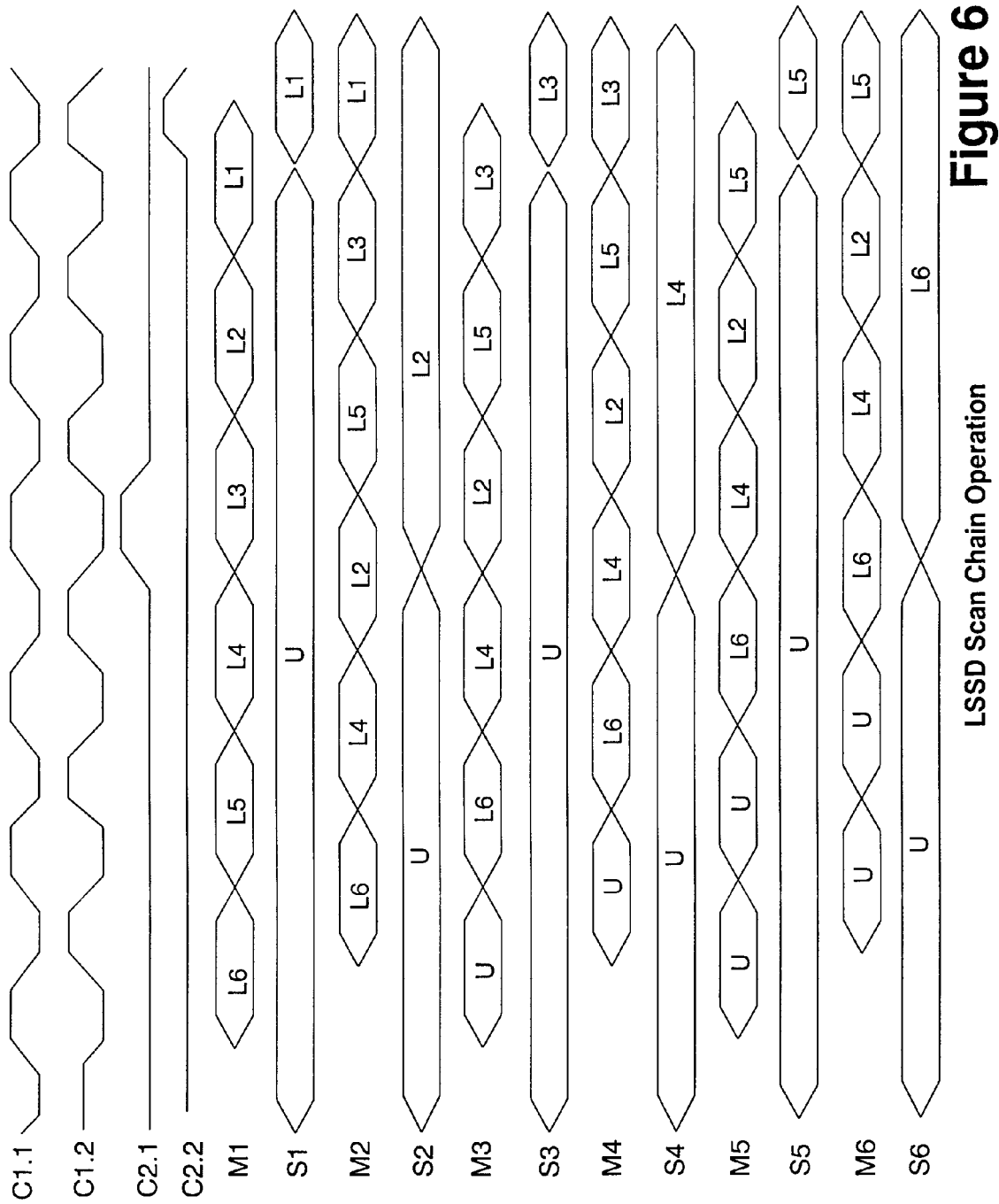
FIG. 6 shows waveforms illustrative of the operation a scan chain consisting of HSS-LSSD latches in accordance with the present invention.

According to the present invention, local clock generation and scan control are combined in a single unit with an augmented local clock buffer LCB & SCAN CTL which is adapted to generate both local clock signals for functional operations and for an at-speed scan operation as illustrated by FIG. 6.

In an alternate embodiment, a single clock CLK2 is used as a single slave clock during a functional operation, and a signal B is used to transfer data into the slave latch during scan operation, with signal B being distributed by distinct by two separate nets B1 and B2 to control sampling of data by alternating slave latches.

This transfer of data into the slave latches during a scan operation occurs only twice, once for all even-numbered slave latches in a scan chain, and once for all odd number slave latches in a scan chain. As a result, these signals can be lower speed without a great impact on overall scanning speed.

An alternative embodiment may use separate high-speed clock nets CLK2.1 and CLK2.2 to transfer data into the slave latches during a scan operation, or a single high speed clock CLK2 combined with a lower-speed selection signal T (distributed in two nets T1 and T2) which is used to inhibit the CLK2 signal for a subset of slave latches. This particular embodiment is advantageous in that it needs only a single high-speed clock net CLK2, as nets T1 and T2 can be switched at slower speeds while CLK2 is inactive.

Referring now to FIG. 6, waveforms are shown which illustrate the operation of the scan chain of FIG. 5 using the C1.1, C1.2, C2.1 and C2.2 clocks in accordance with the present invention. In this exemplary embodiment, it is assumed that the SCAN signal has been asserted to put the master latches into a scan operation mode, and latch data Sin is received on the S port when the CLK1 port is high. As can be seen in this diagram, the number of transitions is $N^2+N$.

Referring now to FIG. 6, there is shown a waveforms diagram illustrative of the operation of a scan chain in accordance with the present invention. In FIG. 6, the clock and scan control signals C1.1, C1.2, C2.1, C2.2 are shown as the top waveforms, the master latches Mn and slave latches Sn are shown in the left column starting at M1 at the top and ending with S6 at the bottom, Ln stands for logic values destined for latch n, and U stands for unused (no signal). Thus, one can see that L6 which represents data values destined for latch 6 are introduced into the master latch M1 at the earliest time in the upper left portion of FIG. 3, and are transferred successively to master latches M2, M3, etc., proceeding diagonally from the upper left to the lower middle, to latch M6, and then at clock C2.1 are transferred to slave latch S6. Note that the data values destined for latch S6 are transferred only through the master latches which change data values a multiple number of times, and that slave latch S6 only changes its data values once when the data values destined for slave latch S6 are in a position in the scan chain to be loaded into slave latch S6. In a similar fashion, each of the master latches M1–M6 changes data values a multiple number of times, and each of the slave latches S1–S6 only changes its data values once when the data values destined for that slave latch are in a position in the scan chain to be loaded into that slave latch. In the far right portion of FIG. 3, the data values destined for latches L1–L6 are stored in slave latches S1–S6. During this sequence of operations, each of the master latches Mn changes data values a multiple number of times and each of the slave latches Sn changes data values only once. This arrangement scans data with a limited number of nodes being switched during scan-in and scan-out of input and result chains, and also isolates the logic under test from random stimulation by the scan chains as they are scanned.

As a result, the power dissipation for scanning the data is significantly reduced, as fewer transitions (which are associated with significant power dissipation) are necessary. Furthermore, only N transitions are presented at the output of the LSSD latches (i.e., the transitions shown for the slave latches S1–S6 in FIG. 6), as opposed to $N^2$ transitions present at the output of S1 to S6 in FIG. 3, reducing the logic activity of the logic attached to outputs of the scan chains, thereby further reducing power dissipation.

Figure 7:
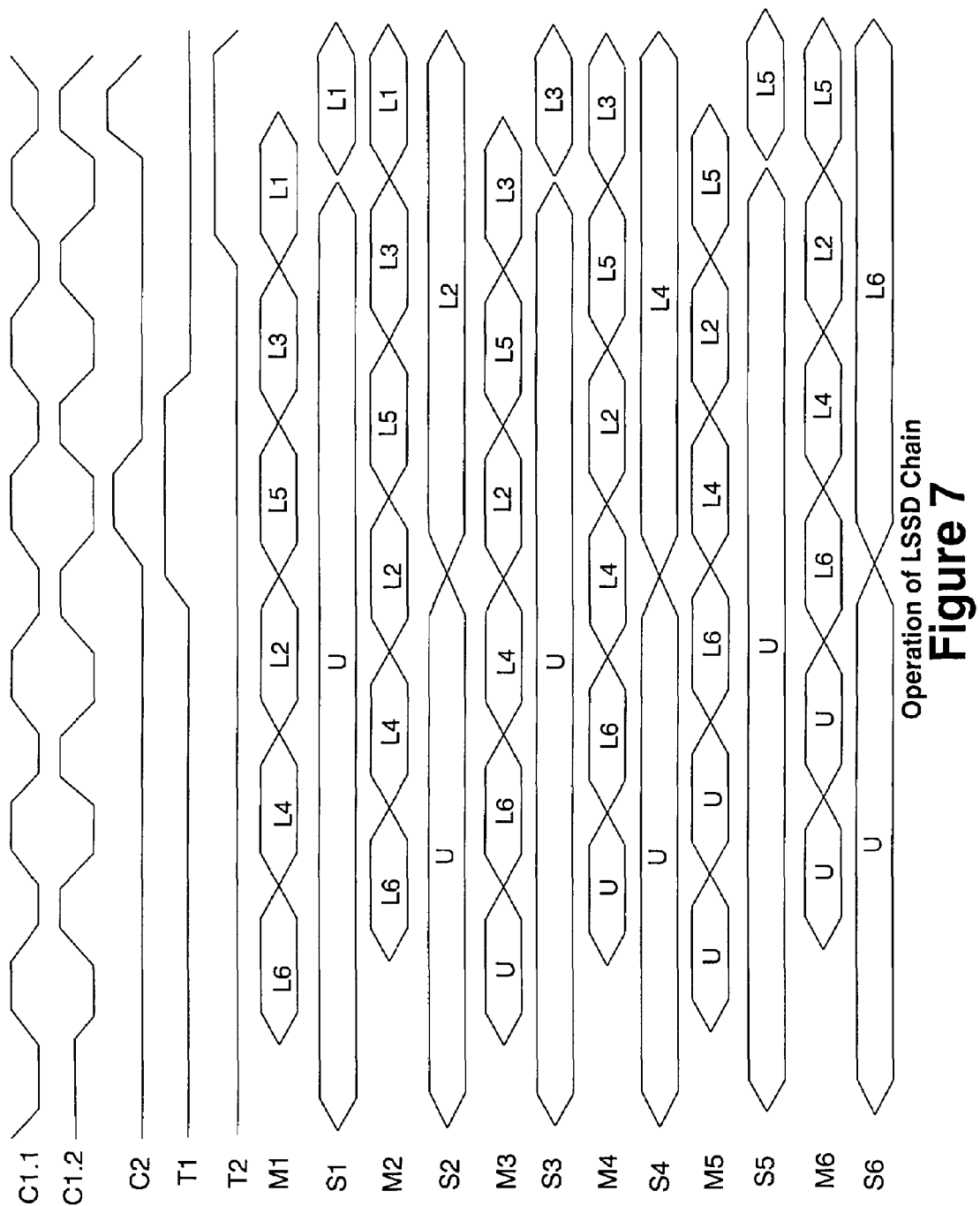
FIG. 7 shows waveforms illustrative of the operation of an LSSD chain in accordance with an alternate embodiment of the present invention.

Referring now to FIG. 7, there is shown the operation of an LSSD chain in accordance with an alternate embodiment of the present invention using low speed signals T1 and T2 to inhibit operation of a single clock C2.

While the descriptions of the operation have shown the scan-in of data values, those skilled in the art will understand that the same circuitry and operation will also be used for the scan-out of data values sampled during the testing.

Those skilled in the art will further appreciate that the described embodiments are optimized for stuck-at fault and DC testing. In another embodiment optimized for AC testing, in addition to stuck-at fault and AC testing, an additional half latch is added to at least a subset of the enhanced LSSD latches to control data launch for AC testing.

Figure 8:
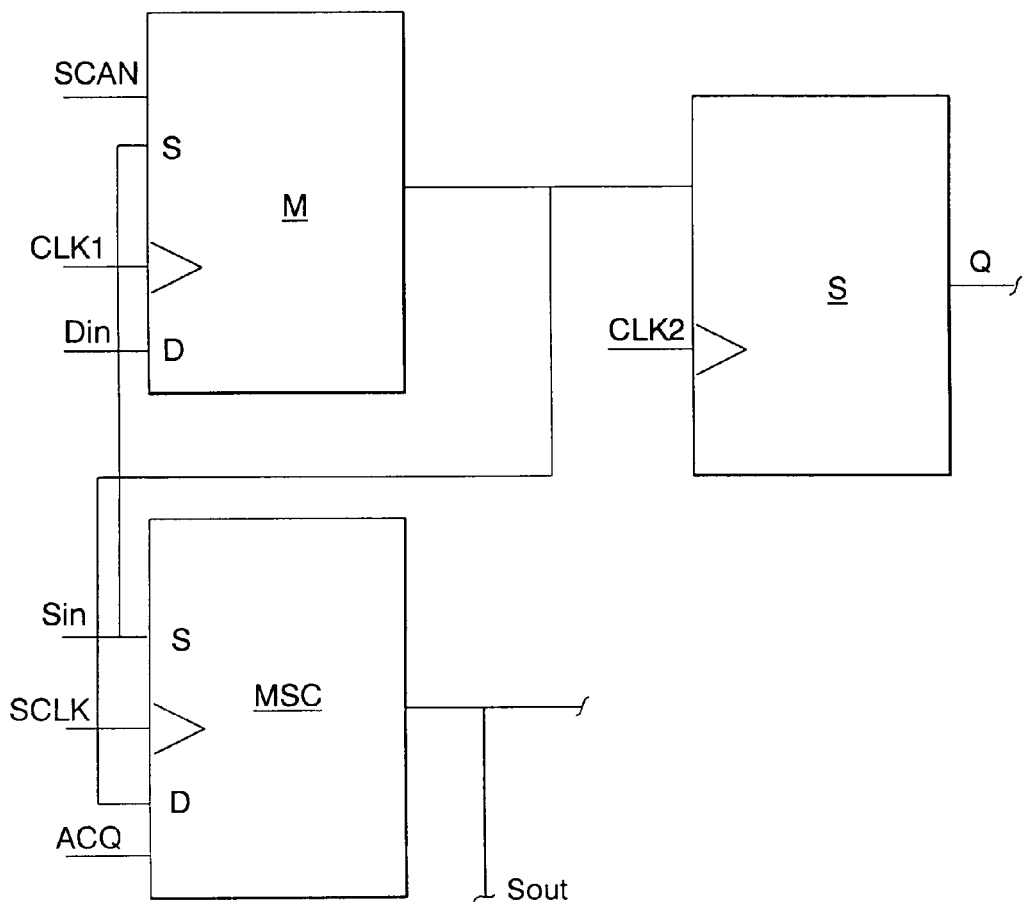
FIG. 8 illustrates an enhanced LSSD master slave latch optimized for AC testing consisting of three latches, a master latch M, a slave latch S, and a latch for implementing the scan chain MSC.

Referring now to FIG. 8, there is shown an enhanced LSSD master slave latch optimized for AC testing. The enhanced latch consists of three latches, a master latch M, a slave latch S, and a latch for implementing the scan chain MSC, with alternating scan latches being clocked by separate non-overlapping scan clock nets being connected to the SCLK port of the MSC latch.

The enhanced latch for AC testing has two modes of operation, a functional mode and a scan mode.

In the functional mode—indicated by an inactive SCAN signal, the data to be latched Din are taken from the D port of the master latch M, and are latched by the master latch M when the CLK1 signal is high. When the CLK2 input to the slave latch S goes high, the output of the master latch M is latched by the slave latch S, and is the output Sout/Q (?) of the master/slave LSSD latch. CLK1 and CLK2 usually are two local non-overlapping high-speed clocks generated by a local clock buffer (LCB) from a global clock G and distributed using high-speed clock wiring.

In the scan mode—indicated by an active SCAN signal, the scan data Sin are scanned using the scan latches controlled by alternating non-overlapping clock signals to scan data into the scan chain. By asserting the SCAN signal, data are also sampled by the master latch and can be launched into the logic by operating CLK2. After one or more cycles of operation, data is captured in the master latches M, and can be transferred into the scan chain (e.g. for the purpose of performing a scan-out of the data) by asserting the ACQ signal to the MSC latch.

As the ACQ and SCAN signals are only used once during operation, they can be distributed using slower signal paths without unduly affecting performance of the scan operation. Furthermore, those skilled in the art will understand that while this description has assumed 2 scan clock nets SCLK1 and SCKL2 connected to alternating enhanced LSSD latches in addition to the clock signals CLK1 and CLK2, that one or more of the scan clock signals may be shared with the functional clock signals.

Furthermore, those skilled in the art will understand that in one embodiment of the present invention, latches according to FIGS. 4 and 8 are alternated to provide the capability to launch a first set of data from the additional storage elements present in latches in accordance with FIG. 8, while a second set of data is launched directly from the scan-chain. Conversely, scan-out will scan out a first set of data directly from values sampled into the scan chain using latches in accordance to FIG. 4, while a second set of data will be scanned out from master latches providing additional storage in accordance with FIG. 8.

Having thus described our invention, what we claim as new and desire to secure by Letters Patent is:

1. A method for performing a scan test operation while reducing power dissipation in latch operations and random logic switching activity in a scan chain which includes a plurality of series connected scan latches, each having a first half latch and a second half latch, the method comprising performing a scan test operation during which data values are scanned through successive series connected first half latches from one series connected first half latch directly into the next series connected first half latch without passing through an intervening second half latch, such that the second half latches are not used to scan data values through successive series connected scan latches of the scan chain, to maintain stable data values in each second half latch of the scan chain during the scan test operation.

2. The method of claim 1, wherein the first half latches of the scan chain change data values a multiple number of times during the scan operation, and each of the second half latches changes its data values only once during the scan operation when data values destined for that second half latch are in a position in the scan chain to be loaded into that second half latch.

3. The method of claim 2, each second half latch of each scan latch providing an output for a logic circuit under test, and each first half latch of each scan latch providing an output scan signal as an input signal for the first half latch of the next series connected scan latch.

4. The method of claim 1, wherein each scan latch comprises a level sensitive scan design LSSD scan latch which comprises:
   a first half master latch M having a first input port D used for operation in a functional mode in which it receives input data Din, and a second input port S used for operation in
   a scan mode in which it receives input scan data Sin, a scan enable input port receiving a scan enable signal SCAN, and a clock input port receiving an input clock signal CLK1, and the master latch M producing output scan data Sout;
   a second half slave latch S having an input port receiving the output scan data Sout from the master latch M and a clock input port receiving an input clock signal CLK2, and the slave latch S producing a data output Q for the logic circuit under test.

5. The method of claim 4, wherein:
   in the functional mode, data to be latched Din are taken from the D port of each master latch M, and are latched by each master latch M under control of the CLK1 signal, and the output of each master latch M is latched by each slave latch S under control of the CLK2 signal and is the output Q of each LSSD scan latch;
   in the scan mode, scan data to be latched Sin are taken from the S port of each master latch M, and are latched by each master latch M under control of the CLK1 signal.

6. The method of claim 4, including connecting the scan chain comprising a series of the master latches M of a series of the LSSD scan latches, wherein the scan output Sout of each master latch M is connected as an input to the next series connected master latch M, and during the scan operation, two successive series connected master latches of two successive series connected LSSD latches are combined to form a master/slave latch for the scan operation.

7. The method of claim 6, including generating distinct master latch clock signals CLK1.1 and CLK1.2 as inputs to the CLK1 ports of alternating LSSD scan latches of the scan chain, and during the functional operation the clock signals CLK1.1 and CLK1.2 comprise the same clock signal, and during the scan operation the clock signals CLK1.1 and CLK1.2 comprise two non-overlapping phase clock signals, and generating distinct slave latch clock signals CLK2.1 and CLK2.2 as inputs to the CLK2 ports of alternating LSSD scan latches of the scan chain, and during the functional operation the clock signals CLK2.1 and CLK2.2 comprise the same clock signal, and during the scan operation the clock signals CLK2.1 and CLK2.2 comprise two non-overlapping phase clock signals.

8. The method of claim 7, including generating said clock signals CLK1.1 and CLK1.2 and said clock signals CLK2.1 and CLK2.2 for both the functional operations and the scan operations by a single local clock generation and scan control unit with an augmented local clock buffer.

9. The method of claim 4, optimized for AC testing, including replacing at least a subset of regular LSSD latches, each of which comprises only one master latch and one slave latch, by enhanced LSSD latches to control data launch, each having a second master latch for implementing the scan chain for AC testing and having an SCLK clock input port and a control ACQ input port, and clocking alternating regular LSSD scan latches and enhanced LSSD scan latches by separate non-overlapping scan clock signals connected to the SCLK port of the MSC latch wherein
   in the functional mode, data to be latched Din are taken from the D port of the master latch M and are latched by the master latch M under control of the CLK1 signal, and the output of the master latch M is latched by the slave latch S under control of the CLK2 signal and is the output of the LSSD scan latch, wherein the clock signals CLK1 and CLK2 are two local non-overlapping high-speed clocks,
   in the scan mode, the scan data Sin are scanned by controlling the LSSD scan latches by alternating non-overlapping clock signals to scan data into the scan chain, data are sampled by the master latch M and are launched into the logic under test by CLK2, and after one or more cycles of operation, data is captured in the master latches M and is transferred into the scan chain by asserting the ACQ signal to the ACQ port of the MSC latch.

10. The method of claim 9, including alternately connecting regular LSSD scan latches and enhanced LSSD scan latches to launch a first set of data from the second master latches in the enhanced LSSD scan latches, and to launch a second set of data directly from the regular LSSD scan latches of the scan chain, and conversely scanning out a first set of data from the MSC master latches of the enhanced LSSD scan latches, and scanning out a second set of data from the regular LSSD scan latches.

11. A scan latch for reducing power dissipation during a scan test operation during testing of a logic circuit under test comprising:

a first half latch having a first input port used for operation in a functional mode in which it receives input data, and a second input port used for operation in a scan mode in which it receives input scan data, a scan enable input port receiving a scan enable signal, and a clock input port receiving an input first clock signal, and the first half latch producing output scan data for a second half latch;

the second half latch having an input port receiving the output scan data from the first half latch and a clock input port receiving an input second clock signal, and the second half latch producing a data output for the logic circuit under test, wherein a plurality of said scan latches are connected in series to form a scan chain producing a plurality of outputs for the logic circuit under test, wherein output scan data produced at each first half latch is input to the next series connected first half latch of said scan chain, without passing through an intervening second half latch, such that the second half latches are not used to scan data values through successive series connected scan latches of the scan chain.

12. The scan latch of claim 11, wherein in the functional mode, data to be latched are taken from the first input port of the first half latch, and are latched by the first half latch under control of the first clock signal, and the output of the first half latch is latched by the second half latch under control of the second clock signal and is the output of the scan latch; and, in the scan mode, scan data to be latched are taken from the second input port of the first half latch and are latched by the first half latch under control of the first clock signal.

13. A scan chain for producing a plurality of outputs for a logic circuit under test, said scan chain comprising a series connection of level sensitive scan design LSSD scan latches, each scan latch for reducing power dissipation during a scan test operation during testing of a logic circuit under test, each LSSD scan latch having:

a first half master latch M having a first input port D used for operation in a functional mode in which it receives input data Din, and a second input port S used for operation in a scan mode in which it receives input scan data Sin, a scan enable input port receiving a scan enable signal SCAN, and a clock input port receiving an input first clock signal CLK1, and the first half master latch M producing output scan data Sout; and, a second half slave latch S having an input port receiving the output scan data Sout from the first half master latch M and a clock input port receiving an input second clock signal CLK2, and the second half slave latch S producing a data output Q for the logic circuit under test, wherein the scan chain comprises a series of the master latches M of said series of the LSSD scan latches, wherein the scan output Sout of each master latch M is an input to the next series connected master latch M, and during the scan operation, two successive series connected master latches of two successive series connected LSSD latches are combined to form a master/slave latch for the scan operation.

14. The scan chain of claim 13, wherein in the functional mode, data to be latched Din are taken from the D port of each master latch M and are latched by each master latch M under control of the CLK1 signal, and the output of each master latch M is latched by each slave latch S under control of the CLK2 signal and is the output Q of each LSSD scan latch;

in the scan mode, scan data to be latched Sin are taken from the S port of each master latch M and are latched by each master latch M under control of the CLK1.

15. The scan chain of claim 13, wherein distinct master latch clock signals CLK1.1 and CLK1.2 are inputs to the CLK1 ports of alternating LSSD scan latches of the scan chain, and during the functional operation the clock signals CLK1.1 and CLK1.2 comprise the same clock signal, and during the scan operation the clock signals CLK1.1 and CLK1.2 comprise two non-overlapping phase clock signals, and distinct slave latch clock signals CLK2.1 and CLK2.2 are inputs to the CLK2 ports of alternating LSSD scan latches of the scan chain, and during the functional operation the clock signals CLK2.1 and CLK2.2 comprise the same clock signal, and during the scan operation the clock signals CLK2.1 and CLK2.2 comprise two non-overlapping phase clock signals.

16. The scan chain of claim 15, wherein a single local clock generation and scan control unit with an augmented local clock buffer generates said local clock signals CLK1.1 and CLK1.2 and said clock signals CLK2.1 and CLK2.2 for both the functional operations and the scan operations.

17. The scan chain of claim 13, optimized for AC testing, wherein at least a subset of regular LSSD latches, each of which comprises only one master latch and one slave latch, are replaced by enhanced LSSD latches to control data launch, each having a second master latch for implementing the scan chain for AC testing and having an SCLK clock input port and a control ACQ input port, with alternating regular LSSD scan latches and enhanced LSSD scan latches being clocked by separate non-overlapping scan clock signals connected to the SCLK port of the MSC latch wherein, in the functional mode, data to be latched Din are taken from the D port of the master latch M and are latched by the master latch M under control of the CLK1 signal, and the output of the master latch M is latched by the slave latch S under control of the CLK2 signal and is the output of the LSSD scan latch, wherein the clock signals CLK1 and CLK2 are two local non-overlapping high-speed clocks, in the scan mode, the scan data Sin are scanned by controlling the LSSD scan latches by alternating non-overlapping clock signals to scan data into the scan chain, data are sampled by the master latch M and are launched into the logic under test by CLK2, and after one or more cycles of operation, data is captured in the master latches M and is transferred into the scan chain by asserting the ACQ signal to the ACQ port of the second master latch.

18. The scan chain of claim 17, wherein regular LSSD scan latches and enhanced LSSD scan latches are alternated to launch a first set of data from the second master latches in the enhanced LSSD scan latches, and a second set of data are launched directly from the regular LSSD scan latches of the scan chain, and conversely a first set of data are scanned out from the second master latches of the enhanced LSSD scan latches, while a second set of data are scanned out from the regular LSSD scan latches.

* * * * *